United States Patent
Yoshimatsu et al.

(10) Patent No.: US 6,521,983 B1
(45) Date of Patent: Feb. 18, 2003

(54) SEMICONDUCTOR DEVICE FOR ELECTRIC POWER

(75) Inventors: Naoki Yoshimatsu, Fukuoka (JP); Takanobu Yoshida, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 100 days.

(21) Appl. No.: 09/714,961

(22) Filed: Nov. 20, 2000

(30) Foreign Application Priority Data

Aug. 29, 2000 (JP) ........................................ 2000-259204

(51) Int. Cl.⁷ .............................................. H01L 23/02
(52) U.S. Cl. ...................... 257/678; 257/690; 257/693; 257/718; 257/719; 257/723
(58) Field of Search ................. 257/690, 693, 257/678, 718, 719, 723

(56) References Cited

U.S. PATENT DOCUMENTS

| 5,373,105 A | * | 12/1994 | Nagaune et al. | ............ | 174/52.2 |
| 5,519,252 A | * | 5/1996 | Soyano et al. | ............ | 257/177 |
| 5,625,536 A | * | 4/1997 | Soyano et al. | ............ | 174/52.2 |
| 5,646,445 A | * | 7/1997 | Masumoto et al. | ............ | 257/703 |
| 5,920,119 A | * | 7/1999 | Tamba et al. | ............ | 257/678 |

FOREIGN PATENT DOCUMENTS

| JP | 6-120390 | 4/1994 |
| JP | 9-232512 | 9/1997 |
| JP | 9-283681 | 10/1997 |
| JP | 10-256411 | 9/1998 |

* cited by examiner

*Primary Examiner*—Vu A. Le
*Assistant Examiner*—Douglas Menz
(74) *Attorney, Agent, or Firm*—Oblon, Spivak, McClelland, Maier & Neustadt, P.C.

(57) ABSTRACT

A semiconductor device for electric power comprising: a resin case; and a main circuit terminally inserted in the resin case, which main circuit terminal has an end on an outwardly connecting side, wherein the end is bent so as to be in parallel with a resin surface of the resin case, a flange nut is in contact with an inner surface of the end on the outwardly connecting side, and the end on the outwardly connecting side is sunk into the resin case so that an outer surface of the end on the outwardly connecting side and the resin surface in the vicinity thereof are on the same planes, whereby only the outer surface is exposed from the resin surface and the main circuit terminal wherein the flange nut and the resin case are monolithically molded to further firmly fix the flange nut.

20 Claims, 12 Drawing Sheets

SEMICONDUCTOR DEVICE FOR ELECTRIC POWER

BACKGROUND OF THE INVENTION

1. Field of the Invention

The present invention relates to a semiconductor for electric power used in electric vehicles and so on, in particular to a structure of a main circuit terminal which is outwardly introduced.

2. Discussion of Background

A semiconductor device for electric power as an intelligent power module (IPM) used to control to drive an electric vehicle is required to have a small size, compactness, a long-lifetime under severe circumstances in terms of temperature, vibration, and so on, and high reliability. A conventional semiconductor device for electric power will be described in reference of FIGS. 11 through 14.

Figure 11:
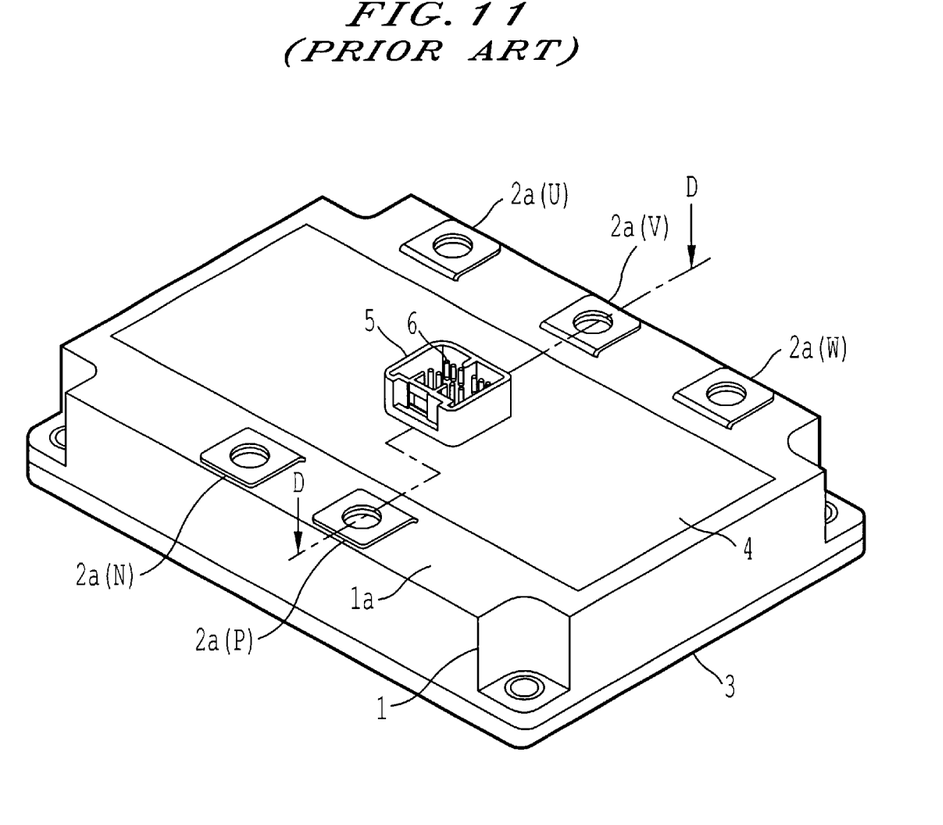
FIG. 11 is a perspective view illustrating an appearance of a conventional semiconductor device for electric power.
Figure 12:
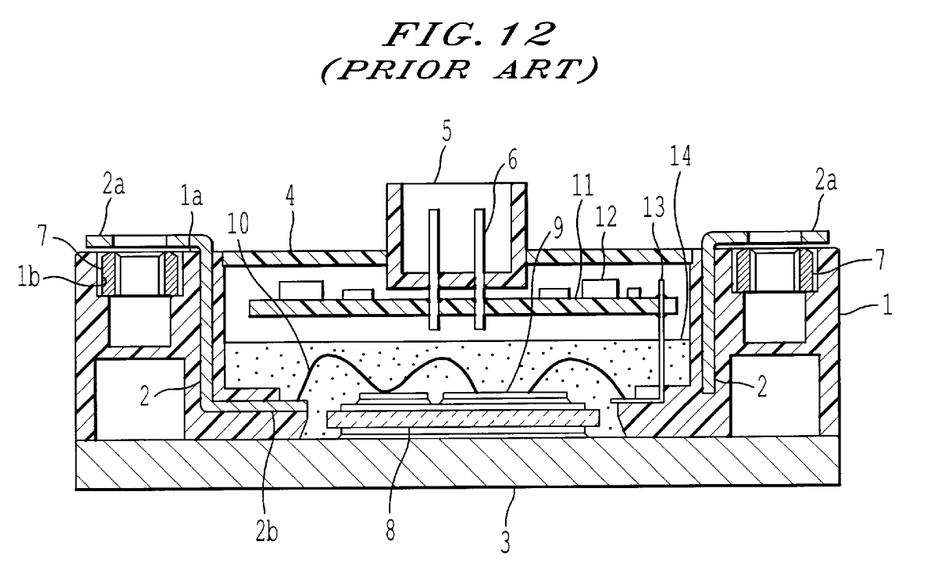
FIG. 12 is a schematic cross-sectional view of the semiconductor device for electric power illustrated in FIG. 11 taken along line D—D.

In FIGS. 11 and 12, numerical reference 1 designates a resin case; numerical reference 2 designates a main circuit terminal inserted in the resin case 1; numerical reference 2a designates an end of the main circuit terminal connecting to an outside and exposed on an outer surface of the resin case 1; and numerical reference 2b designates an end of the main circuit terminal 2 connected to an inside and exposed to an inner surface of the resin case 1. The main circuit terminal 2 is bent at substantially right angles so that a part of the end 2a of the main circuit terminal 2 on the side of connecting to the outside is in parallel to an outwardly exposed resin surface 1a of the resin case 1. Further, numerical reference 3 designates a metallic base plate forming a bottom portion of the resin case 1; numerical reference 4 designates a cover made of a resin; numerical reference 5 designates a connector for a signal circuit, which connector is mounted on a control board 11, described below; and numerical reference 6 designates a signal circuit terminal located in the control board 11. References (P) and (N), affixed to the end 2a of the main circuit terminal 2 for outwardly connecting, respectively designate an input of a positive electricity and an input of a negative electricity. References (U), (V), and (W) designate three phases, i.e. a U-phase, a V-phase, and a W-phase.

Numerical reference 7 designates a nut. The nut 7 is inserted in a hexagonal hole 1b previously formed at time of molding to receive the nut and covered by the end 2a on the outwardly connecting side. The insulating substrate 8 is mounted on the metallic base plate 3 forming a bottom portion of the resin case 1, a semiconductor element for electric power 9 is mounted on the insulating substrate 8, and the end 2b of the main circuit terminal 2 on the inwardly connecting side is connected to the semiconductor element for electric power 9 by an aluminum wire 10. Numerical reference 11 designates the control board, on which the connector 5 for the signal circuit is mounted. On the control board, controlling parts 12 are mounted, and the controlling parts 12 are connected to the semiconductor element for electric power 9 through a relay terminal for signal 13. The insulating substrate 8, the semiconductor element for electric power 9, and so on are sealed by a gel-like sealing resin 14.

Figure 13:
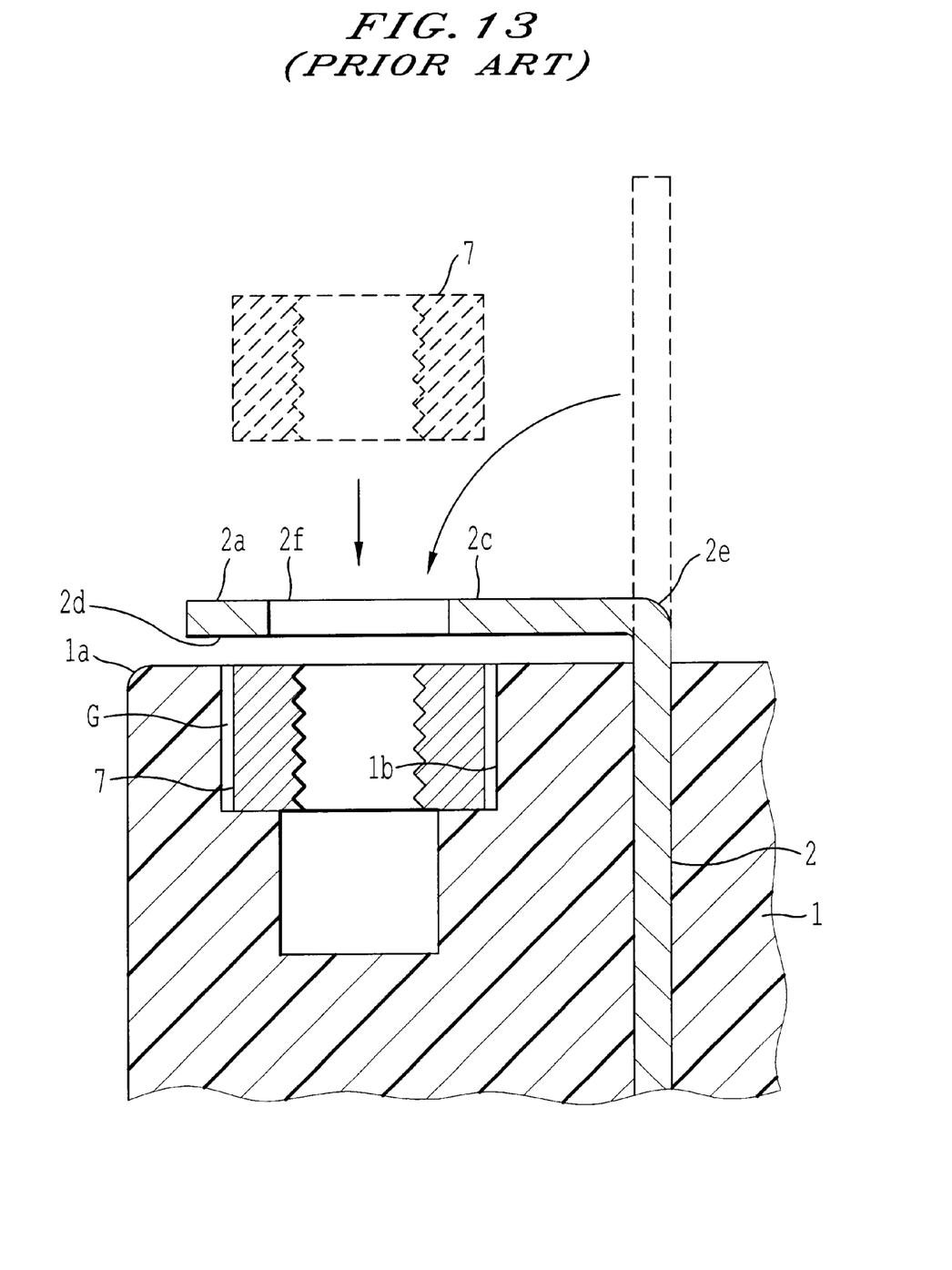
FIG. 13 is an enlarged cross-sectional view of a main circuit terminal of the semiconductor device for electric power illustrated in FIG. 12.

In the following discussion, in reference of FIG. 13, details of a structure of the end 2a on the outwardly connecting side in the main circuit terminal 2 and a method of assembling the same will be described. In FIG. 13, after embedding the nut 7 in the hole 1b formed in the resin case 1, the end 2a on the outwardly connecting side is bent at substantially right angles in a bending portion 2e so that the end 2a on the outwardly connecting side covers the nut 7, whereby an outer surface 2c and an inner surface 2d of the end 2a are substantially parallel with a resin surface 1a of the resin case 1. As a result, the inner surface 2d is positioned on a plane substantially the same as the resin surface 1a. However, there is a small gap between the inner surface 2d and the resin surface 1a. The hole 1b is formed to be larger than the dimensions of the nut 7 in consideration of the capability of assembling the hole 1b and the nut 7, wherein there is a gap G between inner wall surfaces of the hole 1b and the nut 7 embedded in the hole 1b.

A busbar (not shown) being a conductor for outwardly connecting is in contact with the outer surface 2c of the end 2a on the outwardly connecting side, the bolt is screwed to the nut 7 through a hole 2f for a bolt in the end 2a on the outwardly connecting side to fix the busbar (not shown) to the end 2a on the outwardly connecting side. The bolt can be tightened with a relatively large torque for example, 12N-m and so on with respect to a bolt size M6. When mounted on a vehicle, oscillation by a relatively large acceleration, for example 20G, is applied to the resin case 1.

The conventional semiconductor device for electric power was constructed as described above. Therefore, when the nut 7 was tightened with a large torque, because there was the gap G between the nut and the hole 1b formed in the resin case 1 around the nut 7, a corner of the nut 7 was in contact with a wall surface of the hole 1b so as to cause high stress, and therefore the resin case 1 was destroyed. Further, the end 2a on the outwardly connecting side was supported by the bending portion 2e, being an extension of the bending portion 2e, there was a problem that the bending portion 2e was deformed by buckling a large torque. Further, there was a problem that the main circuit terminal was broken at the bending portion 2e by a fatigue failure caused by vibration occurred by a large acceleration applied for a long time.

Figure 14:
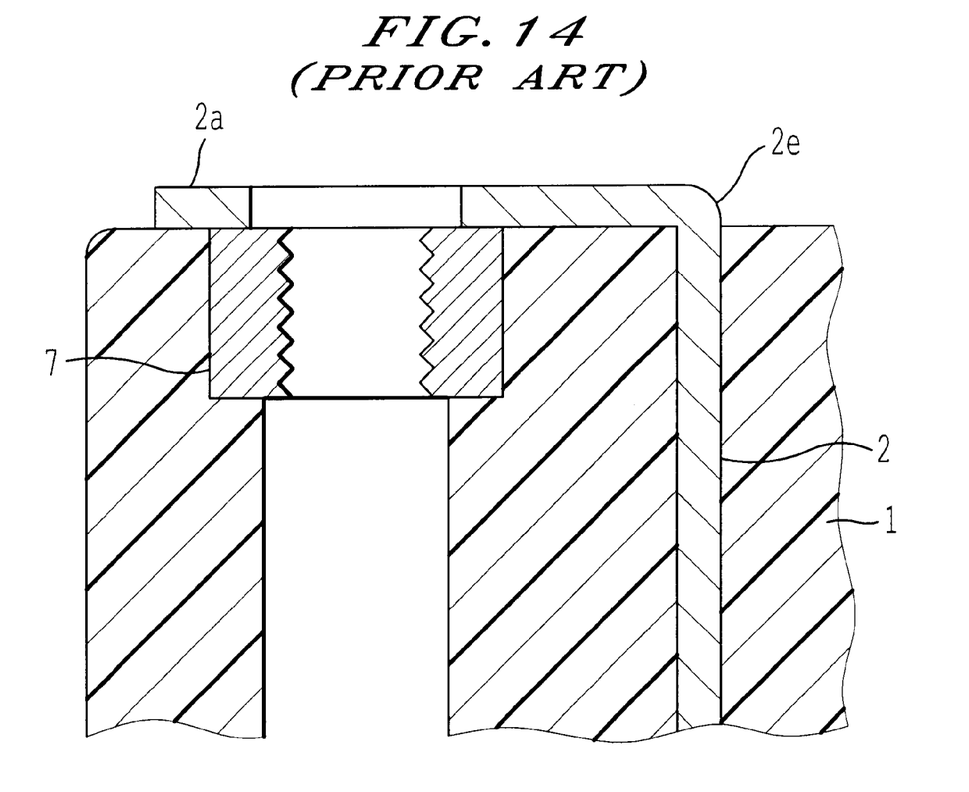
FIG. 14 is an enlarged cross-sectional view of a main circuit terminal of another conventional semiconductor device for electric power.

As a countermeasure to the above-mentioned problems, proposed was the use of a nut 7 molded integrally with a resin case 1 so that a contact surface between an end 2a on an outwardly connecting side and that an inner surface 2d was exposed to avoid a clearance between the nut 7, and the molded resin. In this proposal, however, although a problem that the resin case 1 was broken could be solved, since a tip of the end 2a on the outwardly connecting side was exposed from a bending portion 2e, the above-mentioned buckling problem and breaking problem of the bending portion 2e caused by a fatigue failure could not be solved.

SUMMARY OF THE INVENTION

It is an object of the present invention to solve the above-mentioned problems inherit in the conventional technique and to provide a semiconductor device for electric power having a main circuit terminal which can bear tightening with a large torque and oscillation by a large acceleration.

According to a first aspect of the present invention, there is provided a semiconductor device for electric power comprising: a main circuit terminal sealed by a resin and having an end on an outwardly connecting side, bent so to be parallel with a resin surface of the sealing resin; a nut being in contact with an inner surface of the end on the outwardly connecting side; and a bolt screwed to the nut for fixing an outwardly connecting conductor in contact with an outer surface of the end on the outwardly connecting side, wherein the end on the inwardly connecting side is embedded in an inside portion of the sealing resin so that the outer surface of the end on the outwardly connecting side and the resin surface around the end are in the same planes, or that the outer surface protrudes a bit from the resin surface to make the outer surface expose from the resin surface, and the main circuit terminal and the nut are monolithically molded.

According to a second aspect of the present invention, there is provided a semiconductor device for electric power comprising: a main circuit terminal inserted in a resin case and having an end on an outwardly connecting side, bent so as to be in parallel with a resin surface, from which the main circuit terminal of the resin case protrudes; a nut being in contact with an inner surface of the end on the outwardly connecting side; and a bolt screwed to the nut to fix an outwardly connecting conductor so as to be in contact with an outer surface of the end on the outwardly connecting side, wherein the end on the outwardly connecting side is embedded in the resin case so that the outer surface of the end on the outwardly connecting side and the resin surface around the end on the outwardly connecting side are in the same plane or the outer surface protrudes a bit from the resin surface to expose the outer surface from the resin surface, and the main circuit terminal, the nut, and the resin case are monolithically molded.

According to a third aspect of the present invention, there is provided the semiconductor device for electric power, wherein the nut is a flange nut having a flange, and a surface of the flange is in contact with an inner surface of the end on the outwardly connecting side.

According to a fourth aspect of the present invention, there is provided a semiconductor device for electric power, wherein a radius of a bending portion of the end of the main circuit terminal on the outwardly connecting side is 2 mm or more on the outer surface, and the main circuit terminal is plated after bending.

According to a fifth aspect of the present invention, there is provided the semiconductor device for electric power, further comprising: an anchor formed in at least a part of an outer periphery of the end of the main circuit terminal on the outwardly connecting side so as to protrude from the outer periphery and turn toward an inside of the resin.

According to a sixth aspect of the present invention, there is provided the semiconductor device for electric power, wherein at least one of a surface shaped which is C-shaped, a slanted surface, and a step is formed on an outer surface side of an edge of the outer surface in the end of the main circuit terminal on the outwardly connecting side, and the outer surface side of the edge of the outer periphery is covered by the resin.

According to a seventh aspect of the present invention, there is provided the semiconductor device for electric power, wherein at least a part of the end of the main circuit terminal on the outwardly connecting side in the vicinity of the edge of the outer periphery other than the bending portion on the outer surface is covered by the resin protruding from the outer surface.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

A detailed explanation will now be given of preferred embodiments of the present invention in reference to FIGS. 1 through 10 as follows, wherein the same numerical references are used for the same or similar portions and description of these portions is omitted.

Figure 1:
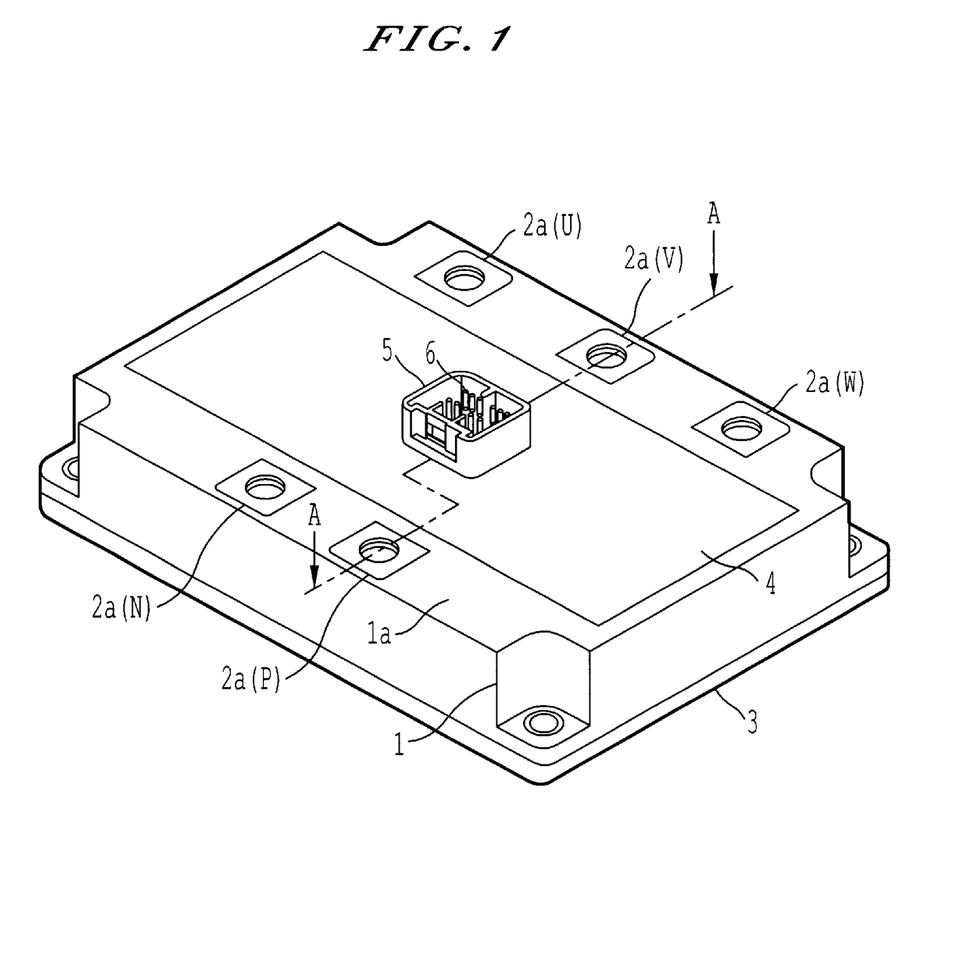
FIG. 1 is a perspective view illustrating an appearance of a semiconductor device for electric power according to Embodiment 1 of the present invention.
Figure 2:
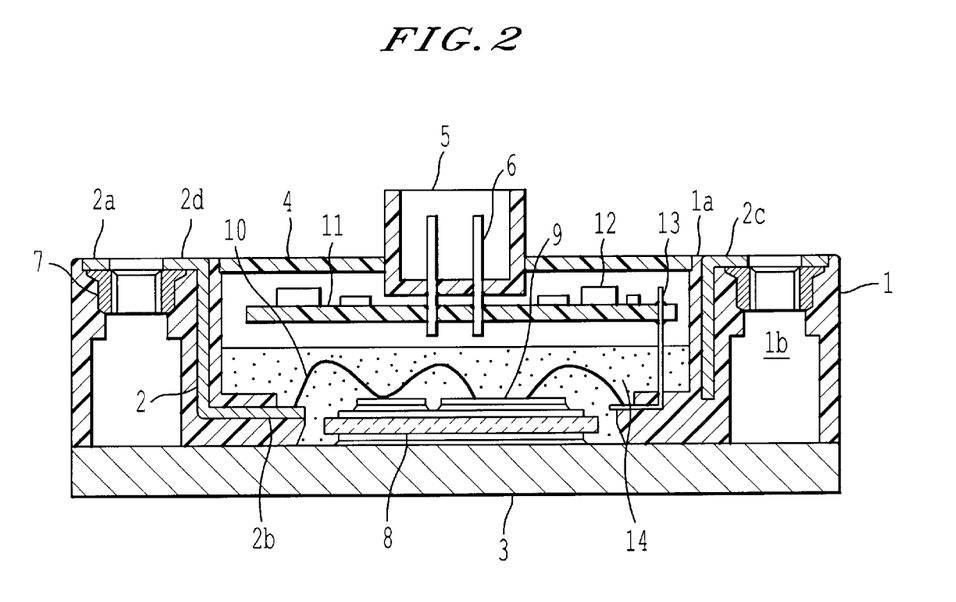
FIG. 2 is a schematic cross-sectional view of the semiconductor device for electric power illustrated in FIG. 1 taken along line A—A.

The semiconductor device for electric power according to Embodiment 1 will be described in reference of FIGS. 1 through 4. In the figures, numerical references which are the same as those in the conventional technique designate portions which are the same as or similar to those in the conventional technique. In FIGS. 1 and 2, numerical reference 1 designates a resin case; numerical reference 2 designates a main circuit terminal inserted in the resin case 1; numerical reference 2a designates an end of the main circuit terminal 2 on an outwardly connecting side, the end being exposed to an outer surface of the resin case 1; and numerical reference 2b designates an end of the main circuit terminal 2 on an inwardly connecting side, the end being exposed to an inner surface of the resin case 1. An outer surface 2c of the end 2a on the outwardly connecting side and an outwardly exposed resin surface 1a of the resin case 1 are arranged on the same plane. The end 2a on the outwardly connecting side is bent at substantially right angles so that an inner surface 2d of the end 2a sinks and extends into the resin surface 1a. Further, numerical reference 3 designates a metallic base plate forming a bottom portion of the resin case 1; numerical reference 4 designates a cover made of a resin; numerical reference 5 designates a connector for a signal circuit mounted on a control board 11 described below; and numerical reference 6 designates a signal circuit terminal 6 located in the signal circuit connector 5. References (P) and (N), affixed to the end 2a of the main circuit terminal 2 on the outwardly connecting side respectively designate an input of positive electricity and an input of negative electricity. References (U), (V), and (W), affixed to the end 2a on the outwardly connecting side in FIG. 1 respectively designate outputs from three phases, i.e. a U-phase, a V-phase, and a W-phase.

Numerical reference 7 designates a flange nut inserted along with the main circuit terminal 2 into the resin case 1, wherein the flange nut has a flange 7a, the flange 7a is in contact with the inner surface 2d of the end 2a on the outwardly connecting side, and the flange nut is sealed by a resin in a state that the flange nut is covered by the end 2a on the outwardly connecting side.

An insulating substrate 8 is mounted on the metallic base plate 3 forming the bottom portion of the resin case 1. A semiconductor element 9 for electric power is mounted on the insulating substrate 8. The end 2b of the main circuit terminal 2 on the inwardly connecting side is connected to the semiconductor element 9 for electric power by an aluminum wire 10. Further, numerical reference 11 designates the control board, on which the connector for signal circuit 5 is mounted. On the control board, controlling parts 12 are mounted, and the control board is connected to the semiconductor element 9 for electric power through a relay terminal 13 for a signal. The insulating substrate 8, the semiconductor element 9 for electric power, and so on are sealed by the sealing resin 14 in a gel-like form.

Figure 3:
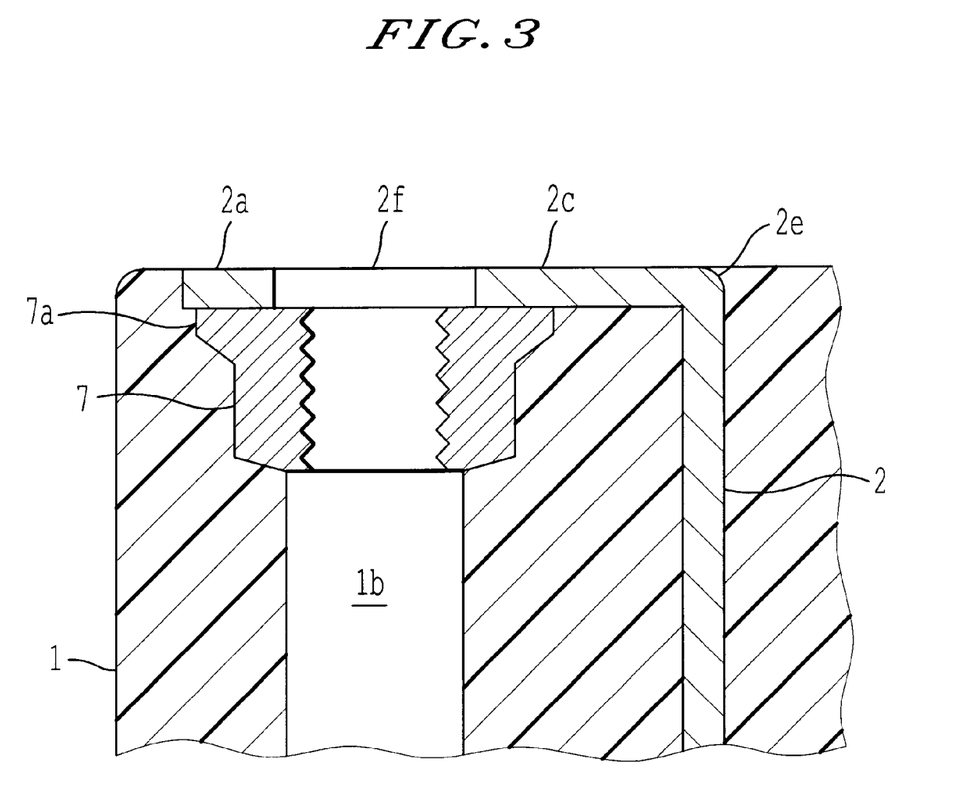
FIG. 3 is an enlarged cross-sectional view of a main circuit terminal of the semiconductor device for electric power illustrated in FIG. 2.

In the next discussion, details of a structure of the end 2a of the main circuit terminal 2 on the outwardly connecting side and a method of assembling will be described in reference of FIG. 3. In FIG. 3, the outer surface 2c of the end 2a on the outwardly connecting side and the outwardly exposing resin surface 1a of the resin case 1 are arranged on the same plane, and the main circuit terminal 2 is bent at substantially right angles at a bending portion 2e so that the inner surface 2d sinks into and is embedded within the resin surface 1a. Namely, the main circuit terminal 2 is bent at substantially right angles at the bending portion 2e, plated, and thereafter inserted in the resin case 1, wherein the end 2a on the outwardly connecting side other than the outer surface 2c sinks into the resin. Numerical reference 2f designates a hole for inserting a bolt 16, described below, which hole is formed in the end 2a on the outwardly connecting side.

Further, the flange nut 7 is inserted in the resin case 1 together with the main circuit terminal 2 in a state such that the flange 7a is in contact with the inner surface 2d of the end 2a on the outwardly connecting side, and sealed by the resin so that the end 2a on the outwardly connecting side covers the flange nut 7.

Figure 4:
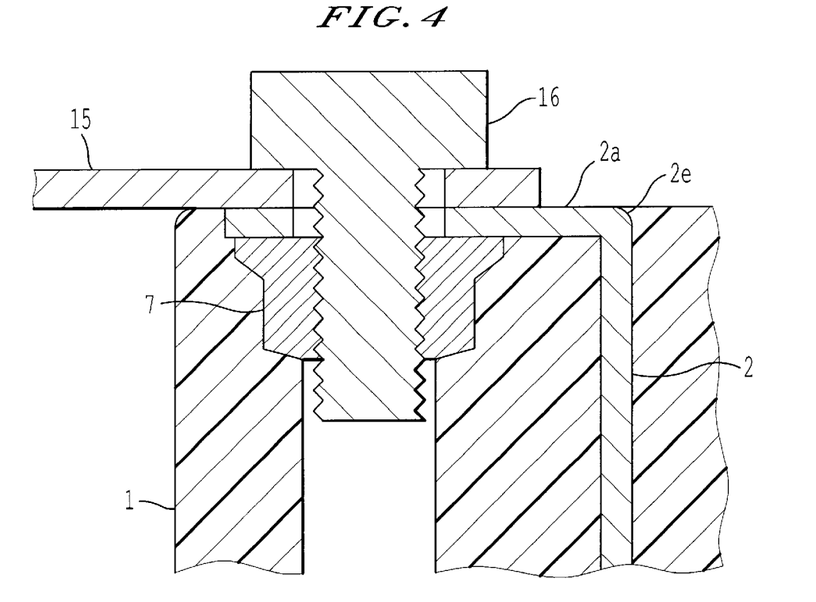
FIG. 4 is a cross-sectional view illustrating a state that a busbar is fixed to the main circuit terminal illustrated in FIG. 3 by tightening a bolt.

When the semiconductor device is practically used, as illustrated in FIG. 4, a busbar as an outwardly connecting conductor 2a is in contact with the outer surface 2c of the end 2a on the outwardly connecting side, the bolt 16 is screwed to the flange nut 7 through the bolt hole 2f of the end 2a on the outwardly connecting side, and the busbar 15 is fixed to the end 2a on the outwardly connecting side. Meanwhile, the bolt 16 is tightened with a relatively large torque such as 12 N-m with respect to a bolt size of M6. When the semiconductor device is mounted on a vehicle, oscillation resulting from a relatively large acceleration such as 20 G is applied to the resin case 1.

However, because the flange nut 7 and the resin case 1 are monolithically molded, there is no clearance between the nut and the molding resin. Therefore, when the bolt is tightened with large torque, there is no danger that high stress occurs at the resin surface by a contact of a corner of the flange nut 7 with the resin surface, whereby the resin case 1 is not destroyed. Further, the outer surface 2c of the end 2a on the outwardly connecting side and the outer resin surface 1a of the resin case 1 are at the same level, and a surface other than the outer surface 2c of the end on the outwardly connecting side being in contact with the busbar 15 sinks into the resin case 1 and fixed thereto. Therefore, the bending portion 2e for supporting the end 2a on the outwardly connecting side is not easily buckled and deformed by the above-mentioned large torque, whereby there is no danger that the bending portion 2e is broken by a fatigue failure caused by the oscillation by the above large acceleration.

Because the end 2a on the outwardly connecting side and the resin case 1 are monolithically molded, accuracy in finishing is high and a process of bending after the molding is not necessitated, whereby the cost thereof becomes low. Also, because the outer surface 2c of the end 2a on the outwardly connecting side and the resin surface 1a around the outer surface 2c are in the same planes, a shape of a die (not shown) is simplified, whereby the machining costs of the die can be reduced.

Further, because the flange nut 7 is used instead of an ordinary nut (not shown), and the flange 7a is in contact with the inner surface 2d of the end 2a on the outwardly connecting side, the outer surface 2c is pushed onto an inner surface of the die by the flange nut 7 in contact with the inner surface 2d of the end 2a on the outwardly connecting side. At this time, the flange 7a having a relatively wide contact surface is directly in contact with the inner surface 2d with pressure, the end 2a on the outwardly connecting side is not deformed by a pressure of the resin applied at time of monolithically molding, whereby a burr of the resin is not adhered to the outer surface 2c.

Embodiment 2

Figure 5:
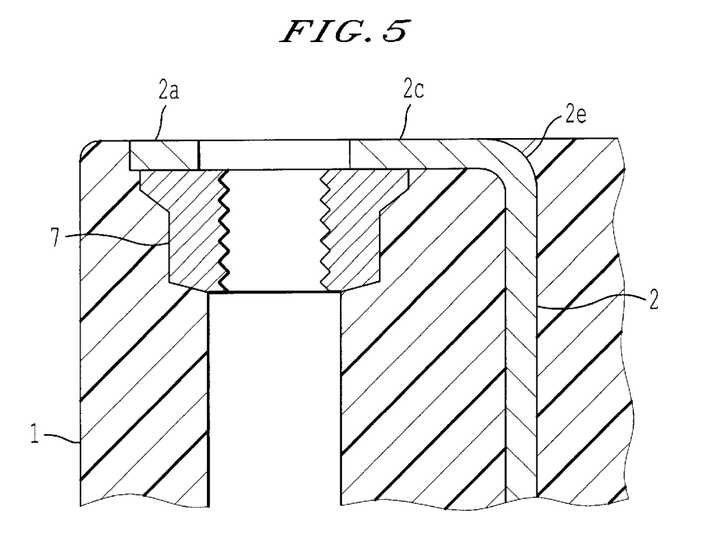
FIG. 5 is an enlarged cross-sectional view of a main circuit terminal in a semiconductor device for electric power according to Embodiment 2 of the present invention.

The semiconductor device for electric power according to Embodiment 2 has a structure different from that of Embodiment 1 illustrated in FIGS. 1 through 4 at points that the bending portion 2e of the end 2a of the main circuit terminal 2 on the outwardly connecting side is processed to have a radius of 2 mm or more, i.e. R2, on the outer surface as illustrated in FIG. 5. The other features of the structure are the same.

Since the bending portion 2e of the end 2a of the main circuit terminal 2 on the outwardly connecting side is bent to have a relatively large radius, a plating layer (not shown) is formed on the main circuit terminal 2, and thereafter the main circuit terminal and the resin case 1 are monolithically molded, it is possible to prevent a minute crack from occurring in the bending portion 2e, which is easily broken in the conventional technique, it is possible to prevent a minute crack from occurring in the plating layer, corrosion resistance is excellent, and reliability becomes high so as to bear oscillation by a large acceleration for a long time.

Embodiment 3

Figure 6:
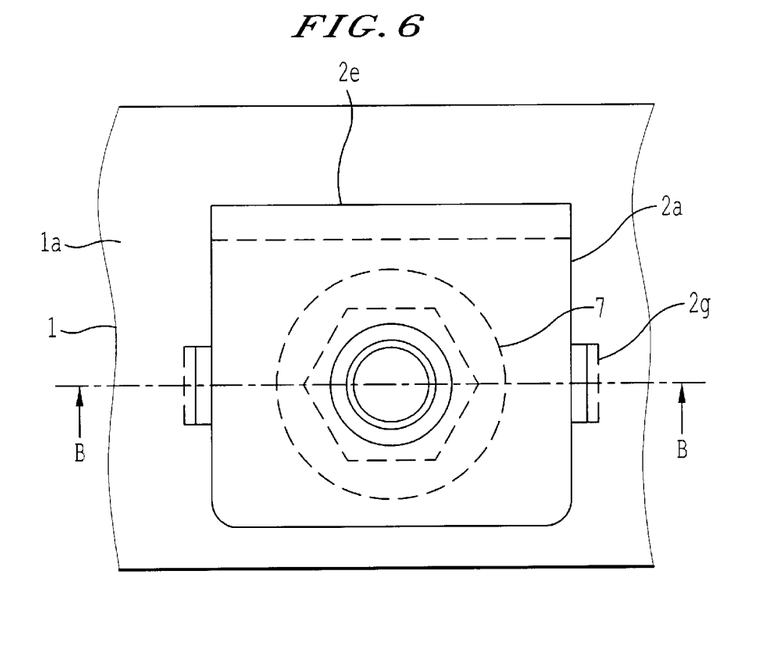
FIG. 6 is an enlarged plan view of a main circuit terminal in a semiconductor device for electric power according to Embodiment 3 of the present invention.
Figure 7:
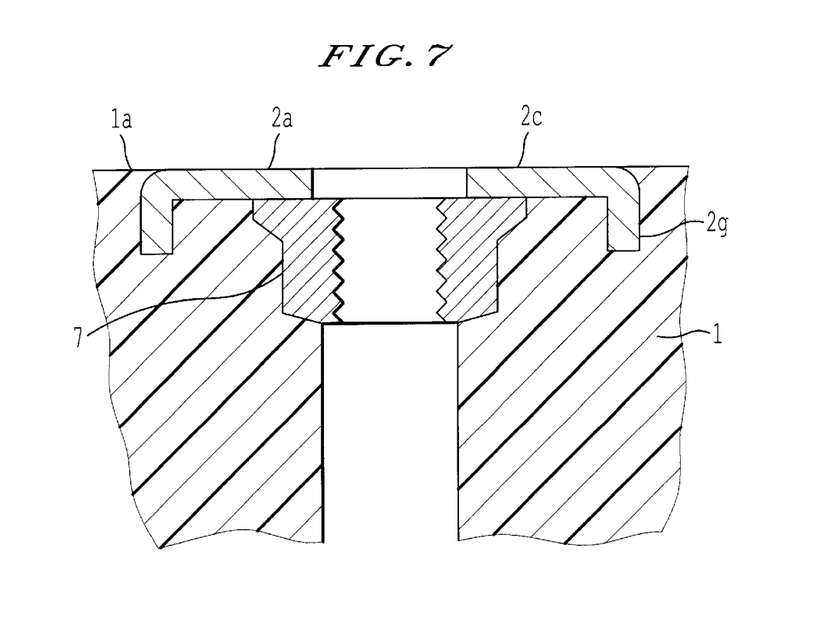
FIG. 7 is a cross-sectional view of a part of the semiconductor device for electric power around the main circuit terminal illustrated in FIG. 6 taken along line B—B.

The semiconductor device for electric power according to Embodiment 3 has a structure different from that of Embodiment 1 illustrated in FIGS. 1 through 4 such that anchors 2g are formed by bending protrusions on both sides of an end 2a on an outwardly connecting side toward an inside of a resin case, and the anchors 2g are embedded in a resin of the resin case 1 as illustrated in FIGS. 6 and 7. The other features of the structures are the same.

Because the end 2a on the outwardly connecting side has the anchors 2g embedded in the resin of the resin case 1 and is firmly fixed to the resin case 1 by an effect of anchoring, a bending portion 2e supporting the end 2a of the outwardly connecting side is not easily buckled and deformed by relatively large torque, whereby strength against tightening by the large torque is excellent, the main circuit terminal is not broken by a fatigue failure caused by an oscillation by a large acceleration, and reliability becomes high.

Embodiment 4

Figure 8:
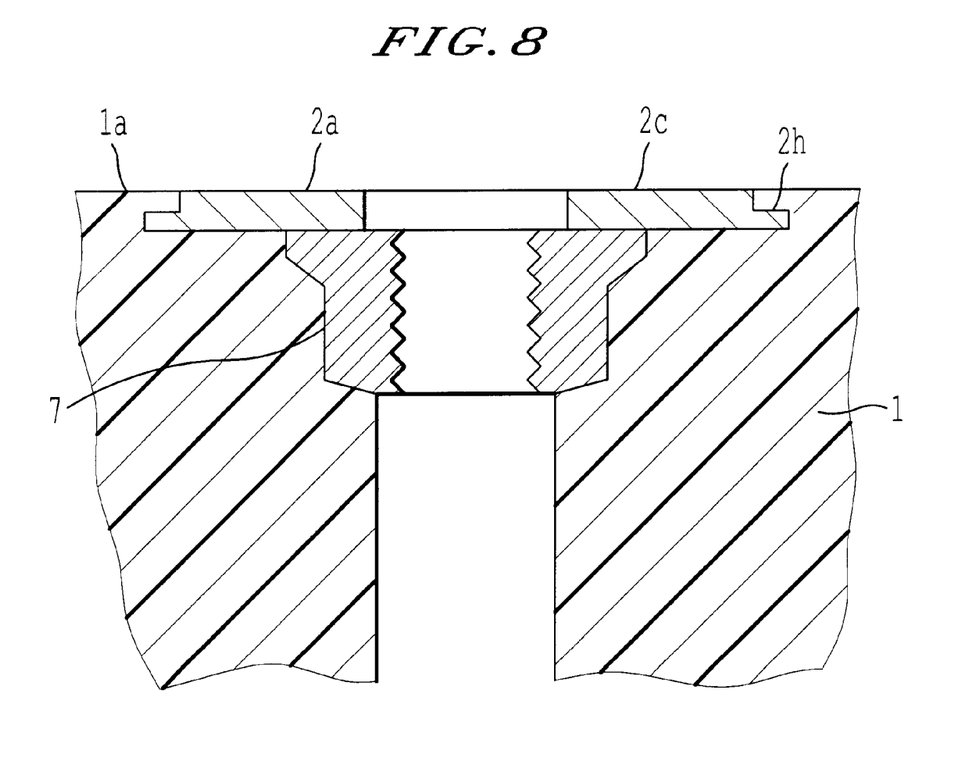
FIG. 8 is an enlarged cross-sectional view of a main circuit terminal of a semiconductor device for electric power according to Embodiment 4 of the present invention.

The semiconductor device for electric power according to Embodiment 4 has a structure different from that of Embodiment 1 illustrated in FIGS. 1 through 4 such that a step 2h is formed in an outer peripheral edge of an end 2a on an outwardly connecting side as illustrated in FIG. 8. The other features of the structures are the same.

Because a molding resin wraps the step 2h and reaches a recess formed in the step 2h, and the recess is covered by the resin, it is possible to prevent the end 2a on the outwardly connecting side from floating, strength against tightening by large torque is excellent, and there is no danger that the main circuit terminal is broken by a fatigue failure caused by an oscillation by a large acceleration, whereby reliability becomes high.

In the semiconductor device for electric power according to Embodiment 4 illustrated in FIG. 8, although the step 2h is formed on a side of the outer surface 2c of the outer peripheral edge in the end 2a of the main circuit terminal 2 on the outwardly connecting side, a surface which is C-shaped or a slanted surface may be formed instead of the step 2h, wherein the molding resin wraps and reaches these surfaces to cover the C-shaped surface or the slanted surface, whereby effects similar to those described above are obtainable.

Embodiment 5

Figure 9:
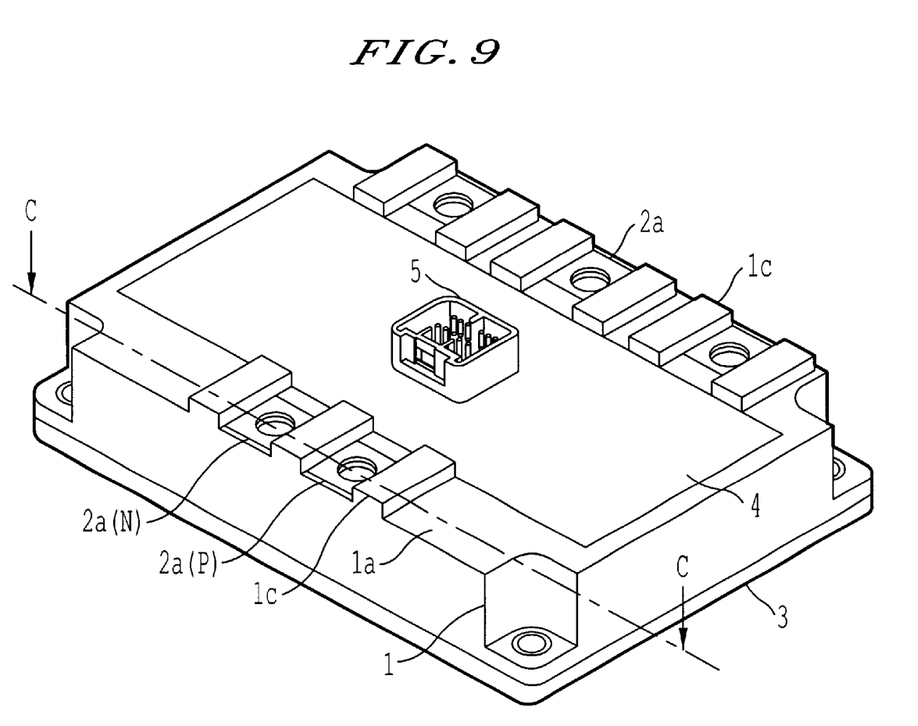
FIG. 9 is a perspective view illustrating an appearance of a semiconductor device for electric power according to Embodiment 5 of the present invention.
Figure 10:
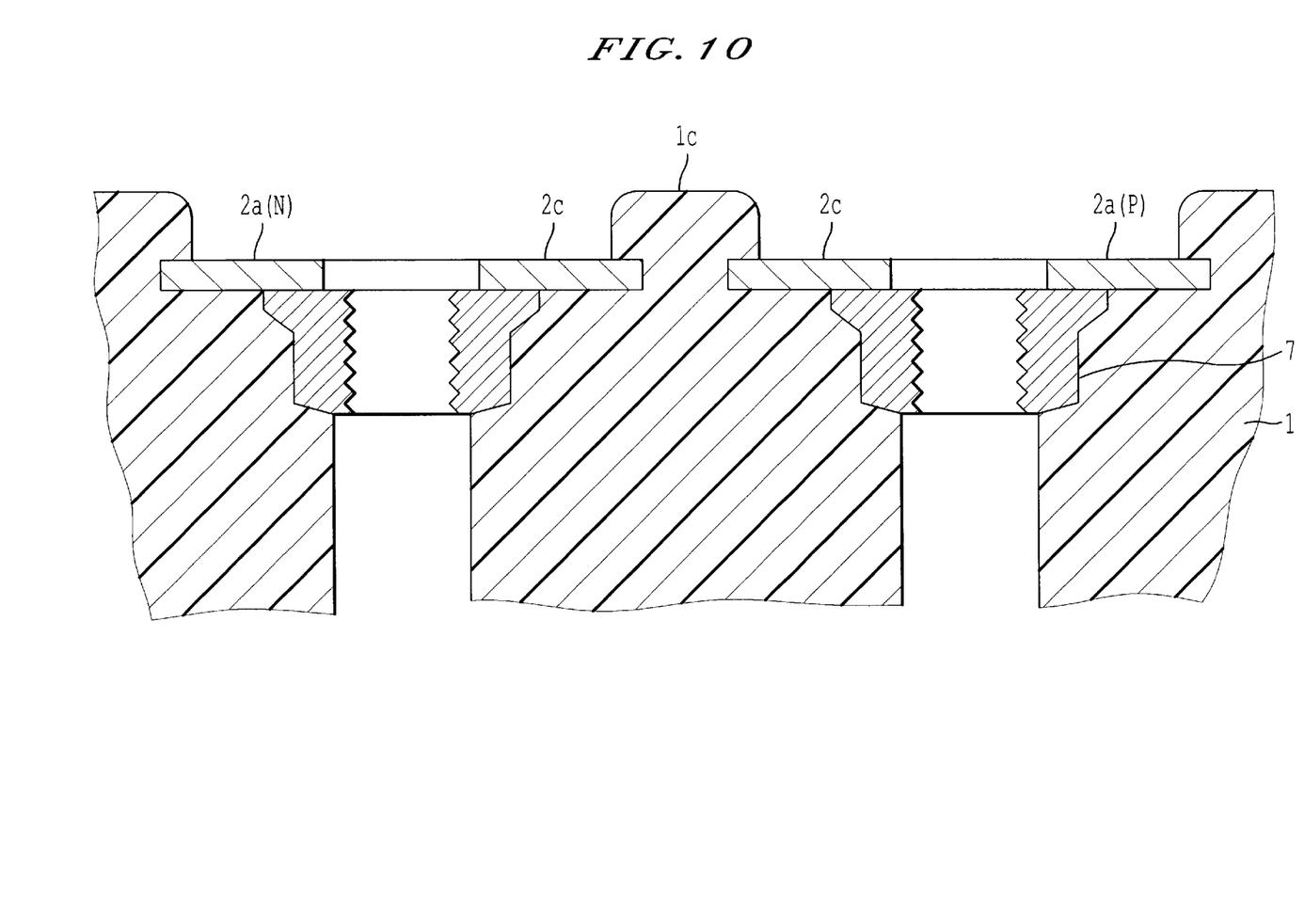
FIG. 10 is a cross-sectional view of the semiconductor device for electric power illustrated in FIG. 9 taken along line C—C.

The semiconductor device for electric power according to Embodiment 5 has a structure different from that described in Embodiment 1 illustrated in Figures through 4 such that a resin protrusion 1c protruding higher than an outer surface 2c covers both sides of the outer surface 2c of an end 2a on an outwardly connecting side, which both sides are in perpendicular with the bending portion 2e, as illustrated in FIGS. 9 and 10. The other features of the structures are the same.

Because the end 2a on the outwardly connecting side is secured by the resin protrusion 1c protruding more than the outer surface 2c, it is possible to prevent the end 2a on the outwardly connecting side from floating, strength against tightening by a large torque is excellent, and the semiconductor device can bear an oscillation by a large acceleration. Further, the resin protrusion 1c works as an insulating barrier between adjacent main circuit terminals 2, for example, a positive terminal 2a (P) and a negative terminal 2a (N). Accordingly, it is possible to make the distance between the adjacent main circuit terminals 2 closer while keeping a requisite insulation distance, the inductance can be reduced, and the resin case can be made small and compact.

As described, the semiconductor device for electric power according to Embodiment 1 through 5 illustrated in FIGS. 1 through 10 can be produced with a high accuracy of finishing because the end 2a on the outwardly connecting side and the resin case 1 are monolithically molded and also can be produced at a low cost because the process of bending after molding is unnecessitated.

Further, except for Embodiment 5, because the resin surface 1a of the resin case 1 and the outer surface 2c of the end on the outwardly connecting side are on the same planes, an inner surface of the die is relatively simplified, and a machining cost of the die is reduced. Although, in Embodiment 5, the resin protrusion 1c protruding more than the outer surface 2c of the end 2a on the outwardly connecting side exists, accuracy of the elected resin of the resin protrusion 1c is not required, it is possible to reduce the machining cost of the die in a manner similar to the above.

In the semiconductor devices for electric power according to Embodiments 1 through 5 illustrated in FIGS. 1 through 10, the flange nut 7 is used as the nut inserted in the resin case 1 together with the main circuit terminal 2, and the flange 7a is in contact with the inner surface 2d of the end 2a on the outwardly connecting side. However, the nut is not limited to the flange nut 7, and an ordinary nut (not shown) may be used to obtain effects to that in the flange nut as long as the thickness of the end 2a on the outwardly connecting side is sufficiently thick, and there is no danger that a burr of the resin is not formed on the outer surface 2c by a deformation of the end 2a on the outwardly connecting side by a pressure of the resin applied at time of molding the resin case 1.

Further the semiconductor devices for electric power according to Embodiments 1 through 5 illustrated in FIGS. 1 through 10 have the resin case 1. However, the semiconductor devices are not limited to that having the resin case 1, and the resin case 1 may be omitted by transfer-molding the insulating substrate on the metallic base, the semiconductor element for electric power mounted on the insulating substrate, the main circuit terminal, the controlling parts, the relay terminal for signal, and so on so as to be monolithic, whereby effects similar to those described above are obtainable.

The first advantage of the semiconductor device for electric power has high reliability to bear tightening with large torque, and the machining cost of the die can be reduced because a shape of the die is simple.

The second advantage of the semiconductor device for electric power according to the present invention is that the semiconductor device for electric power having high accuracy is obtainable at a low cost because the main circuit terminal is molded together with the resin case and no bending process is necessitated after molding.

The third advantage of the semiconductor device for electric power according to the present invention is that the end on the outwardly connecting side is not deformed by a molding pressure, and it is possible to prevent a resin burr from being produced on the outer side surface of the end.

The fourth advantage of the semiconductor device for electric power according to the present invention is that it is possible to prevent a minute crack from occurring in the bending portion and the plated portion thereon, and the semiconductor device for electric power has high reliability to withstand oscillation due to a large acceleration for a long time.

The fifth advantage of the semiconductor device for electric power according to the present invention is that the end on the outwardly connecting side is firmly fixed, strength against tightening with large torque is excellent, and it is possible to bear oscillation generated by a large acceleration.

The sixth advantage of the semiconductor device for electric power according to the present invention is that it is possible to prevent the end on the outwardly connecting side from floating, strength against tightening with large torque is excellent, it is possible to bear oscillation by a large acceleration, the insulating distance between the main terminals is maintained, and the semiconductor device has a small size and compactness.

What is claimed is:

1. A semiconductor device for electric power comprising:
    a main circuit terminal sealed by a resin forming a case and having an end on an outwardly connecting side, bent to be in parallel with a resin surface of the sealing resin;
    a nut in contact with an inner surface of the end on the outwardly connecting side; and
    a bolt screwed to the nut for fixing an outwardly connecting conductor in contact with an outer surface of the end on the outwardly connecting side,
    wherein the end on the outwardly connecting side is embedded in one of an inside portion of the sealing resin, so that the outer surface of the end on the outwardly connecting side and the resin surface around the end are in the same planes, and in an outer surface protrusion of the sealing resin which protrudes from one of the resin surface and the case, and
    the main circuit terminal and the nut are monolithically molded.

2. The semiconductor device for electric power according to claim 1,
    wherein the nut comprises a flange nut having a flange, and a surface of the flange is in contact with an inner surface of the end on the outwardly connecting side.

3. The semiconductor device for electric power according to claim 2,
    wherein a radius of a bending portion of the end of the main circuit terminal on the outwardly connecting side is 2 mm or more on the outer surface, and
    the main circuit terminal is plated after bending.

4. The semiconductor device for electric power according to claim 2, further comprising:
    an anchor formed in at least a part of an outer periphery of the end of the main circuit terminal on the outwardly connecting side so as to protrude from the outer periphery and turn toward an inside of the resin.

5. The semiconductor device for electric power according to claim 2,
    wherein at least one of a C-shaped surface, a slanted surface, and a step is formed on an outer surface side of an edge of the outer surface in the end of the main circuit terminal on the outwardly connecting side, and
    the outer surface side of the edge of the outer periphery is covered by the resin.

6. The semiconductor device for electric power according to claim 2,
    wherein at least a part of the end of the main circuit terminal on the outwardly connecting side in the vicinity of the edge of the outer periphery other than the bending portion on the outer surface is covered by the resin protruding from the outer surface.

7. The semiconductor device for electric power according to claim 1,
    wherein a radius of a bending portion of the end of the main circuit terminal on the outwardly connecting side is 2 mm or more on the outer surface, and
    the main circuit terminal is plated after bending.

8. The semiconductor device for electric power according to claim 7,
    wherein at least one of a C-shaped surface, a slanted surface, and a step is formed on an outer surface side of an edge of the outer surface in the end of the main circuit terminal on the outwardly connecting side, and
    the outer surface side of the edge of the outer periphery is covered by the resin.

9. The semiconductor device for electric power according to claim 1, further comprising:
    an anchor formed in at least a part of an outer periphery of the end of the main circuit terminal on the outwardly connecting side so as to protrude from the outer periphery and turn toward an inside portion of the resin.

10. The semiconductor device for electric power according to claim 1,
    wherein at least one of a C-shaped surface, a slanted surface, and a step is formed on an outer surface side of an edge of the outer surface in the end of the main circuit terminal on the outwardly connecting side, and
    the outer surface side of the edge of the outer periphery is covered by the resin.

11. The semiconductor device for electric power according to claim 1,
    wherein at least a part of the end of the main circuit terminal on the outwardly connecting side in the vicinity of the edge of the outer periphery other than the bending portion on the outer surface is covered by the resin protruding from the outer surface.

12. A semiconductor device for electric power comprising:
    a main circuit terminal inserted in a resin case and having an end on an outwardly connecting side, bent so as to be in parallel with a resin surface from which the main circuit terminal of the resin case protrudes;
    a nut in contact with an inner surface of the end on the outwardly connecting side; and
    a bolt screwed to the nut to fix an outwardly connecting conductor so as to be in contact with an outer surface of the end on the outwardly connecting side,
    wherein the end on the outwardly connecting side is embedded in one of the resin case so that the outer surface of the end on the outwardly connecting side and the resin surface around the end on the outwardly connecting side are in the same plane and in an outer surface protrusion of the resin which protrudes from one of the resin surface and the case, and
    the main circuit terminal, the nut, and the resin case are monolithically molded.

13. The semiconductor device for electric power according to claim 2,
    wherein the nut comprises a flange nut having a flange, and a surface of the flange is in contact with an inner surface of the end on the outwardly connecting side.

14. The semiconductor device for electric power according to claim 13, further comprising:
    an anchor formed in at least a part of an outer periphery of the end of the main circuit terminal on the outwardly connecting side so as to protrude from the outer periphery and turn toward an inside of the resin.

15. The semiconductor device for electric power according to claim 13,
    wherein at least one of a C-shaped surface, a slanted surface, and a step is formed on an outer surface side of an edge of the outer surface in the end of the main circuit terminal on the outwardly connecting side, and
    the outer surface side of the edge of the outer periphery is covered by the resin.

16. The semiconductor device for electric power according to claim 13,
    wherein at least a part of the end of the main circuit terminal on the outwardly connecting side in the vicinity of the edge of the outer periphery other than the bending portion on the outer surface is covered by the resin protruding from the outer surface.

17. The semiconductor device for electric power according to claim 12, wherein a radius of a bending portion of the end of the main circuit terminal on the outwardly connecting side is 2 mm or more on the outer surface, and the main circuit terminal is plated after bending.

18. The semiconductor device for electric power according to claim 12, further comprising:

an anchor formed in at least a part of an outer periphery of the end of the main circuit terminal on the outwardly connecting side so as to protrude from the outer periphery and turn toward an inside of the resin.

19. The semiconductor device for electric power according to claim 12, wherein at least one of a C-shaped surface, a slanted surface, and a step is formed on an outer surface side of an edge of the outer surface in the end of the main circuit terminal on the outwardly connecting side, and the outer surface side of the edge of the outer periphery is covered by the resin.

20. The semiconductor device for electric power according to claim 12, wherein at least a part of the end of the main circuit terminal on the outwardly connecting side in the vicinity of the edge of the outer periphery other than the bending portion on the outer surface is covered by the resin protruding from the outer surface.

\* \* \* \* \*